(12) United States Patent
Wu et al.

(10) Patent No.: US 10,879,276 B2
(45) Date of Patent: Dec. 29, 2020

(54) DISPLAY PANEL AND DISPLAY DEVICE

(71) Applicant: XIAMEN TIANMA MICRO-ELECTRONICS CO., LTD., Xiamen (CN)

(72) Inventors: Huangyao Wu, Xiamen (CN); Hongbo Zhou, Xiamen (CN); Xiufeng Zhou, Xiamen (CN); Boping Shen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/435,045

(22) Filed: Jun. 7, 2019

(65) Prior Publication Data

US 2020/0176478 A1    Jun. 4, 2020

(30) Foreign Application Priority Data

Dec. 3, 2018 (CN) .......................... 2018 1 1467475

(51) Int. Cl.
*H01L 27/12* (2006.01)
*G02F 1/1362* (2006.01)
*G02F 1/1368* (2006.01)
*G06F 3/041* (2006.01)
*G06F 3/044* (2006.01)

(52) U.S. Cl.
CPC .......... *H01L 27/124* (2013.01); *G02F 1/1368* (2013.01); *G02F 1/136286* (2013.01); *G06F 3/0412* (2013.01); *G06F 3/0444* (2019.05); *G06F 3/0446* (2019.05); *H01L 27/1218* (2013.01)

(58) Field of Classification Search
CPC combination set(s) only.
See application file for complete search history.

(56) References Cited

U.S. PATENT DOCUMENTS

| | | | |
|---|---|---|---|
| 2018/0196565 A1* | 7/2018 | Qu | G02F 1/136286 |
| 2019/0005915 A1* | 1/2019 | Liu | G02F 1/13454 |
| 2019/0109184 A1* | 4/2019 | Li | H01L 27/3276 |
| 2019/0227362 A1* | 7/2019 | Sun | G02F 1/1333 |
| 2019/0296051 A1* | 9/2019 | Qin | H01L 27/124 |
| 2020/0057519 A1* | 2/2020 | Zhao | G02F 1/13338 |

FOREIGN PATENT DOCUMENTS

CN     108037626 A     5/2018

* cited by examiner

*Primary Examiner* — Deeprose Subedi
(74) *Attorney, Agent, or Firm* — Anova Law Group PLLC

(57) ABSTRACT

A display panel comprises a display area and a non-display area surrounding the display area. The display area includes gate lines extending in a row direction, data lines extending in a column direction, and an irregular-shaped edge. The irregular-shaped edge includes at least one sub-edge which is recessed towards an inside of the display area to form a notch, and edges of the irregular-shaped edge other than the at least one sub-edge extend in the column direction. The non-display area includes a first sub-area disposed adjacent to the at least one sub-edge. The data lines include at least one irregular-shaped data line, and the at least one irregular-shaped data line includes a winding portion disposed at the first sub-area. The first sub-area includes a compensation electrode, and in a direction perpendicular to the display panel, the compensation electrode is at least partially overlapped with the winding portion.

16 Claims, 11 Drawing Sheets

DISPLAY PANEL AND DISPLAY DEVICE

CROSS-REFERENCES TO RELATED APPLICATIONS

This application claims the priority of Chinese Patent Application No. CN201811467475.6, filed on Dec. 3, 2018, the entire contents of all of which are incorporated herein by reference.

FIELD OF THE DISCLOSURE

The present disclosure generally relates to the display technology and, more particularly, relates to a display panel and a display device thereof.

BACKGROUND

As electronic technology advances, manufacturing technology of display panels is continuing to mature. Existing display panels mainly include liquid crystal display panels, organic light-emitting display panels, and electronic-paper display panels, etc. To increase the screen size and enhance the appearance of the display device, increasing the screen-to-body ration gradually becomes a development trend.

Existing display devices, such as displays, televisions, mobile phones, tablets, etc., often have generally regular rectangular screens. With continuous development of display technology and diversified user demands on the of display devices, simple rectangular display devices may not meet the consumer desires. Therefore, various shapes of display devices have emerged. In the existing technologies, the display device is often designed to have a shape other than a regular rectangle, and such a display device is named as an irregular-shaped display device. The irregular-shaped display devices are able to diversify the screen of the display devices, thereby being applied to various products.

In addition, based on the structural design of the full screen, a notch is required to be disposed at the irregular-shaped display panel to mount a camera, an earpiece, a sensor, and the like. However, the display performance of the irregular-shaped display panel with the notch is not well, and a split screen is likely to occur. Accordingly, the uniformity of the display performance is poor, which degrades the display performance of the display panel.

The disclosed display panel and display device thereof are directed to solve one or more problems set forth above and other problems.

BRIEF SUMMARY OF THE DISCLOSURE

One aspect of the present disclosure provides a display panel. The display panel comprises a display area and a non-display area surrounding the display area. The display area includes a plurality of gate lines extending in a row direction, a plurality of data lines extending in a column direction, and an irregular-shaped edge, wherein the irregular-shaped edge includes at least one sub-edge which is recessed towards an inside of the display area to form a notch, and edges of the irregular-shaped edge other than the at least one sub-edge extend in the column direction. The non-display area includes a first sub-area disposed adjacent to the at least one sub-edge. The plurality of data lines include at least one irregular-shaped data line, and the at least one irregular-shaped data line includes a winding portion disposed at the first sub-area. The first sub-area includes a compensation electrode, and in a direction perpendicular to the display panel, the compensation electrode is at least partially overlapped with the winding portion.

Another aspect of the present disclosure provides a display device. The display device comprises a display panel. The display panel comprises a display area and a non-display area surrounding the display area. The display area includes a plurality of gate lines extending in a row direction, a plurality of data lines extending in a column direction, and an irregular-shaped edge, wherein the irregular-shaped edge includes at least one sub-edge which is recessed towards an inside of the display area to form a notch, and edges of the irregular-shaped edge other than the at least one sub-edge extend in the column direction. The non-display area includes a first sub-area disposed adjacent to the at least one sub-edge. The plurality of data lines include at least one irregular-shaped data line, and the at least one irregular-shaped data line includes a winding portion disposed at the first sub-area. The first sub-area includes a compensation electrode, and in a direction perpendicular to the display panel, the compensation electrode is at least partially overlapped with the winding portion.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which may be illustrated in the accompanying drawings. Hereinafter, embodiments consistent with the disclosure will be described with reference to drawings. Wherever possible, the same reference numbers will be used throughout the drawings to refer to the same or like parts. It may be apparent that the described embodiments may be some but not all of the embodiments of the present disclosure. Based on the disclosed embodiments, persons of ordinary skill in the art may derive other embodiments consistent with the present disclosure, all of which may be within the scope of the present disclosure. Further, in the present disclosure, the disclosed embodiments and the features of the disclosed embodiments may be combined under conditions without conflicts.

Figure 1:
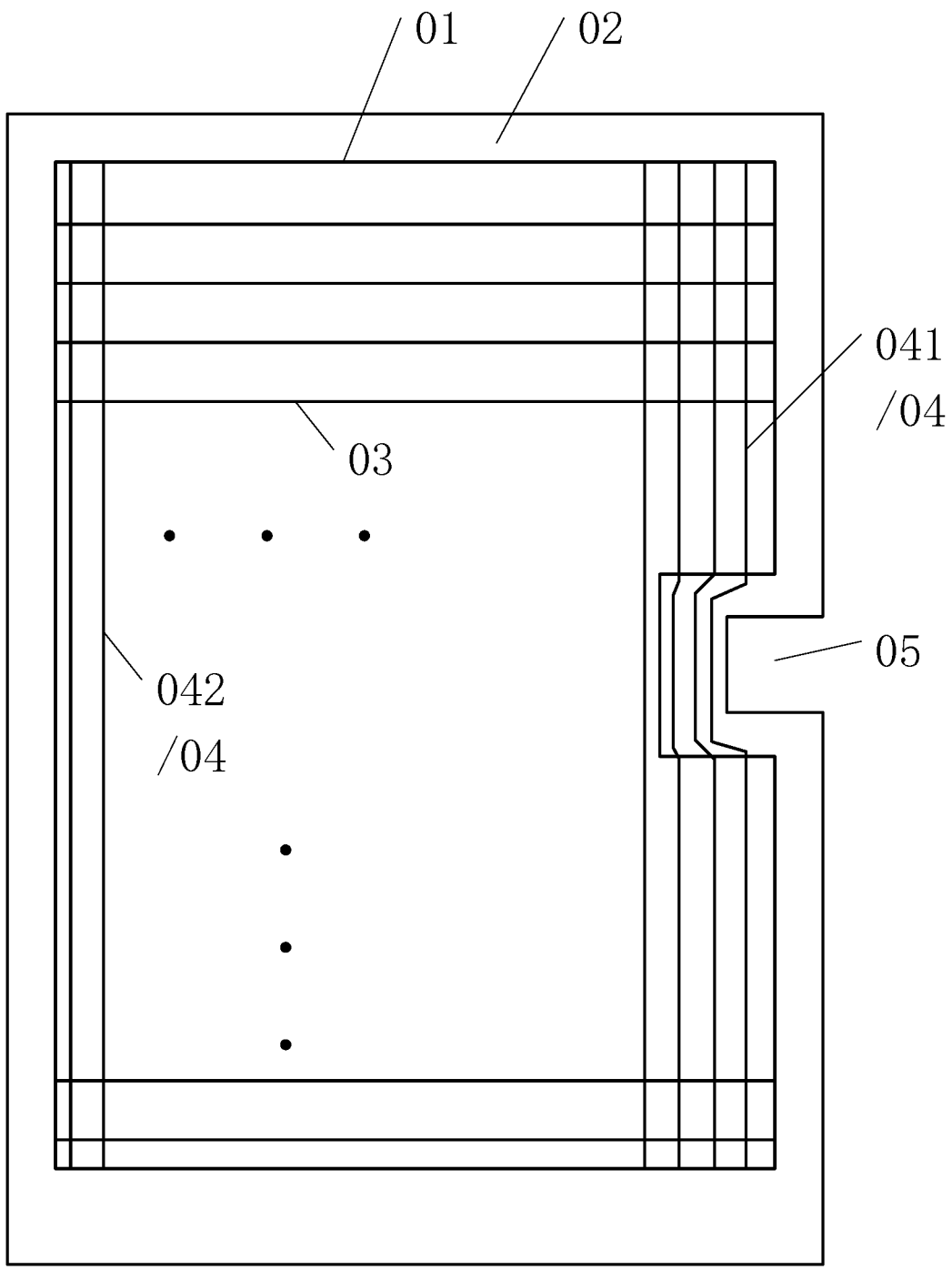
FIG. 1 illustrates a schematic top view of an existing display panel.

As discussed in the background, when a notch is disposed at the display panel, a split screen is likely to occur. FIG. 1 illustrates a schematic top view of an existing display panel. As shown in FIG. 1, the display panel includes a display area 01 and a peripheral area 02. The display area 01 includes a plurality of gate lines 03 and a plurality of data lines 04. The display panel is provided with a notch 05, and an electronic component such as a camera is disposed at the notch 05. Because the display panel is provided with the notch 05, a portion of first data lines 041 have to be wound or routed from the peripheral area 02 to bypass the notch 05. The data lines other than the first data lines are second data lines 042 which do not have to be wound from the peripheral area 02 to bypass the notch 05.

The display area 01 is provided with a common electrode (not drawn) for realizing the display function while the peripheral area 02 not. The coupling capacitance of the first data line 041 and the common electrode is different from the coupling capacitance of the second data line 042 and the common electrode and, thus, the load of the first data line 041 is different from the load of the second data line 042, which causes a longitudinal split-screen of the display area 01 and, thus, the non-uniform display effects.

To solve one or more problems set forth above and other problems, the present disclosure provides a display panel and a display device thereof.

Figure 2:
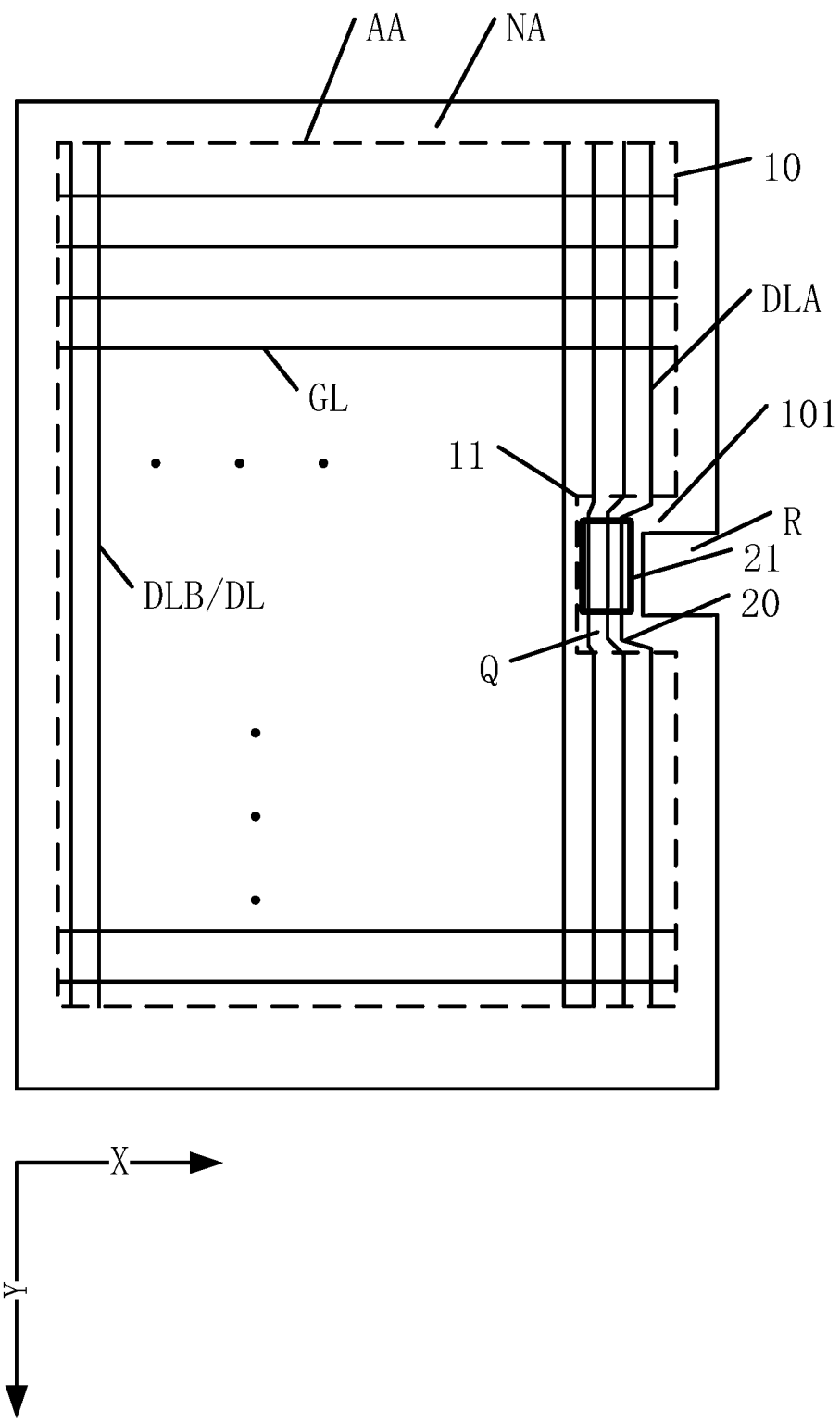
FIG. 2 illustrates a schematic top view of an exemplary display panel consistent with the disclosed embodiments.

FIG. 2 illustrates a schematic top view of an exemplary display panel consistent with the disclosed embodiments. As shown in FIG. 2, the display panel may include a display area AA and a non-display area NA surrounding the display area AA. The display area AA may include a plurality of gate lines GL, a plurality of data lines DL, and an irregular-shaped edge 10. The gate lines GL may extend in a row direction X, and the data lines DL may extend in a column direction Y. The irregular-shaped edge 10 may include at least one sub-edge 11 which is recessed towards the inside of the display area AA to form a notch Q. The edges of the irregular-shaped edge 10 other than the sub-edge 11 may extend in the column direction Y.

The non-display area NA may include a first sub-area 101 disposed adjacent to the sub-edge 11. The plurality of data lines DL may include at least one irregular-shaped data line DLA, and the irregular-shaped data line DLA may include a winding portion 20 disposed at the first sub-area 101. The first sub-area 101 may include a compensation electrode 21, and the compensation electrode 21 and the winding portion 20 may at least partially overlap with each other in a direction perpendicular to the display panel.

In the disclosed embodiments, the display area AA may include the irregular-shaped edge 10. Although the entire irregular-shaped edge 10 does not have a straight segment shape (e.g., the irregular-shaped edge 10 is a curved line) and includes the sub-edge 11 recessed towards the inside of the display area AA, the portion of the irregular-shaped edge 10 other than the sub-edge 11 may have a straight segment shape extending in the column direction Y. Also, because the sub-edge 11 is often substantially short, the influence of the sub-edge 11 on the overall extension direction of the irregular-shaped edge 10 may be small. Therefore, the general extending direction of the irregular-shaped edge 10 may be substantially the same as the extending direction of the data line DL, i.e., both extending in the column direction Y.

In the disclosed embodiments, the display area AA of the display panel may be irregular-shaped, and the display area AA may include the notch Q. Correspondingly, the display panel may form a groove R at the position of the notch Q. When the display panel is applied to the display device, the notch Q and the groove R may bypass or give way to the space where an electronic component such as a camera is disposed, which may realize the full screen.

Because the display area AA includes the notch Q, at least one data line may be desired to be routed from the first sub-area 101, i.e., the irregular-shaped data line DLA. In one embodiment, the data lines except the irregular-shaped data line DLA may be regular data lines DLB. It should be noted that, for illustrative purposes, FIG. 2 shows three irregular-shaped data lines DLA. In practical applications, the number of the irregular-shaped data lines DLA may be one, two, four, or five or more, which is not limited by the present disclosure.

The irregular-shaped data line DLA may extend through the non-display area NA. The non-display area NA may include a first sub-area 101, and the first sub-area 101 and the display area AA may be separated by a sub-edge 11. A portion of the irregular-shaped data line DLA where the portion is disposed at the first sub-area 101 may be the winding portion 20. The first sub-area 101 may include at least one winding portion 20.

In the disclosed embodiments, the compensation electrode 21 may be disposed at the first sub-area 101, and the compensation electrode 21 and the winding portion 20 may at least partially overlap with each other in a direction perpendicular to the display panel. FIG. 2 illustrates a view obtained by observing the display panel in the direction perpendicular to the display panel and, thus, the direction perpendicular to the display panel is a direction perpendicular to the plane of FIG. 2. In the direction perpendicular to the display panel, the compensation electrode 21 may overlap with a portion of the winding portion 20 or may completely cover the winding portion 20. For illustrate purposes, FIG. 2 shows the compensation electrode 21 partially overlaps with the winding portion 20 in the direction perpendicular to the display panel.

In the disclosed embodiments, the compensation electrode 21 may be disposed at the first sub-area 101, and the compensation electrode 21 and the winding portion 20 may be overlapped to form a coupling capacitance, thereby increasing the load of the irregular-shaped data line DLA. Accordingly, the load difference between the irregular-shaped data line DLA and the regular data line DLB may be reduced, the split-screen of the display panel may be suppressed.

The area of the compensation electrode 21 may be designed according to the actual requirements of the display panel. For example, when the load difference between the irregular-shaped data line DLA and the regular data line DLB is large, the area of the compensation electrode 21 may be appropriately increased, thereby increasing the coupling capacitance between the compensation electrode 21 and the irregular-shaped data line DLA. When the load difference between the irregular-shaped data line DLA and the regular data line DLB is small, the area of the compensation electrode 21 may be appropriately reduced, thereby preventing the coupling capacitance between the compensation electrode 21 and the irregular-shaped data line DLA from being excessive.

Moreover, the distance between the compensation electrode 21 and the winding portion 20 in the direction perpendicular to the display panel may also be designed according to actual needs. For example, when the load difference between the irregular-shaped data line DLA and the regular data line DLB is large, the distance between the compensation electrode 21 and the winding portion 20 in the direction perpendicular to the display panel may be appropriately reduced, thereby increasing the coupling capacitance between the compensation electrode 21 and the irregular-shaped data line DLA. When the load difference between the irregular-shaped data line DLA and the regular data line DLB is small, the distance between the compensation electrode 21 and the winding portion 20 in the direction perpendicular to the display panel may be appropriately increased, thereby preventing the coupling capacitance between the compensation electrode 21 and the irregular-shaped data line DLA from being excessive.

That is, both the area of the compensating electrode 21 and the distance between the compensating electrode 21 and the winding portion 20 in the direction perpendicular to the display panel may be designed according to various application scenarios, which is not limited by the present disclosure.

In the disclosed embodiments, the display area AA may have an irregular shape with the notch Q, at least one data line may be desired to be routed from the first sub-area 101, i.e., the irregular-shaped data line DLA. A portion of the irregular-shaped data line DLA in the first sub-area 101 may be the winding portion 20. The compensation electrode 21 may be disposed at the first sub-area 101, and the compensation electrode 21 and the winding portion 20 may be overlapped to form a coupling capacitance, thereby increasing the load of the irregular-shaped data line DLA. Compared to the existing display panel, in the disclosed display panel, the load difference between the irregular-shaped data line DLA and the regular data line DLB may be reduced, such that the split-screen of the display panel may be suppressed, the uniformity of the display performance may be improved, and the display performance may be enhanced.

Referring to FIG. 2, the display panel may include a groove R that penetrates the display panel along the thickness direction of the display panel. The groove R and the first sub-area 101 may be disposed adjacent to each other in the row direction X. It should be noted that the thickness direction of the display panel is the direction perpendicular to the plane of FIG. 2. In the disclosed embodiments, the notch Q and the groove R may be disposed correspondingly. When the display panel is applied to the display device, the groove R may be able to bypass the space for accommodating an electronic component, which may realize the display performance of the full screen.

Figure 3:
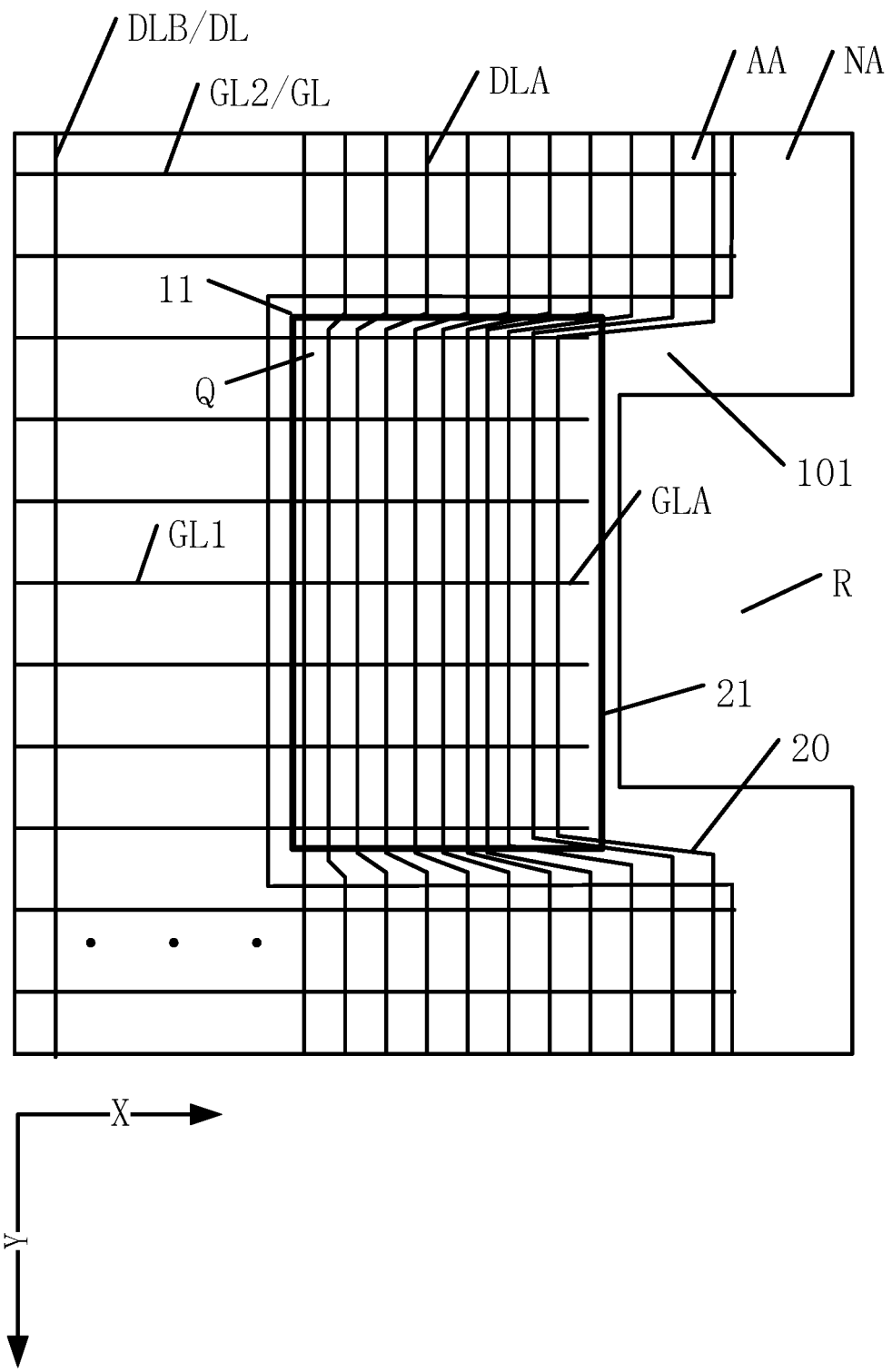
FIG. 3 illustrates a schematic top view of another exemplary display panel consistent with the disclosed embodiments.

FIG. 3 illustrates a schematic top view of another exemplary display panel consistent with the disclosed embodiments. The similarities between FIG. 3 and FIG. 2 are not repeated here, while certain differences may be explained. As shown in FIG. 3, the plurality of gate lines GL include at least one first gate line GL1, and the first gate line GL1 may include an extending portion GLA disposed at the first sub-area 101. The compensation electrode 21 and the extending portion GLA may overlap in the direction perpendicular to the display panel.

In the disclosed embodiments, because the display area AA has the notch Q, at least one gate line may have to be routed from the first sub-area 101, i.e., the first gate line GL1. In some embodiments, the gate lines other than the first gate line GL1 may be regular gate lines GL2. The first gate line GL1 may extend through the first sub-area 101 and may include the extension GLA disposed at the first sub-area 101. The regular gate lines GL2 may be disposed outside the first sub-area 101.

Because the display area AA has the notch Q, the length of the first gate line GL1 at the display area AA may be smaller than the length of the regular gate line GL2 at the display area AA. The compensation electrode 21 may overlap with the extending portion GLA to form a coupling capacitor, which may increase the load of the first gate line GL1, reduce the load difference between the first gate line GL1 and the regular gate line GL2. Thus, the uniformity of the display performance may be improved, and the display performance may be enhanced.

It should be noted that, for illustrative purposes, FIG. 3 shows seven first gate lines GL1. In practical applications, the number of the first gate lines GL1 may be one, two, three, four, five, six, eight or more, which is not limited by the present disclosure.

Referring to FIG. 3, the extending portion GLA and the winding portion 20 overlap in a direction perpendicular to the display panel.

In the display area AA, the gate lines may be intersecting and electrically insulated from the data lines, and the gate lines and the data lines may form coupling capacitance at the intersecting positions. In the disclosed embodiments, a plurality of extending portions GLA may be intersecting and electrically insulated from a plurality of winding portions 20, such that the extending portion GLA and the winding portion 20 may form coupling capacitance at the intersections, which may further reduce the load difference between the irregular-shaped data line DLA and the regular data line DLB and the load difference between the first gate line GL1 and the regular gate line GL2. Accordingly, the uniformity of the display performance may be improved, and the display performance may be enhanced.

Figure 4:
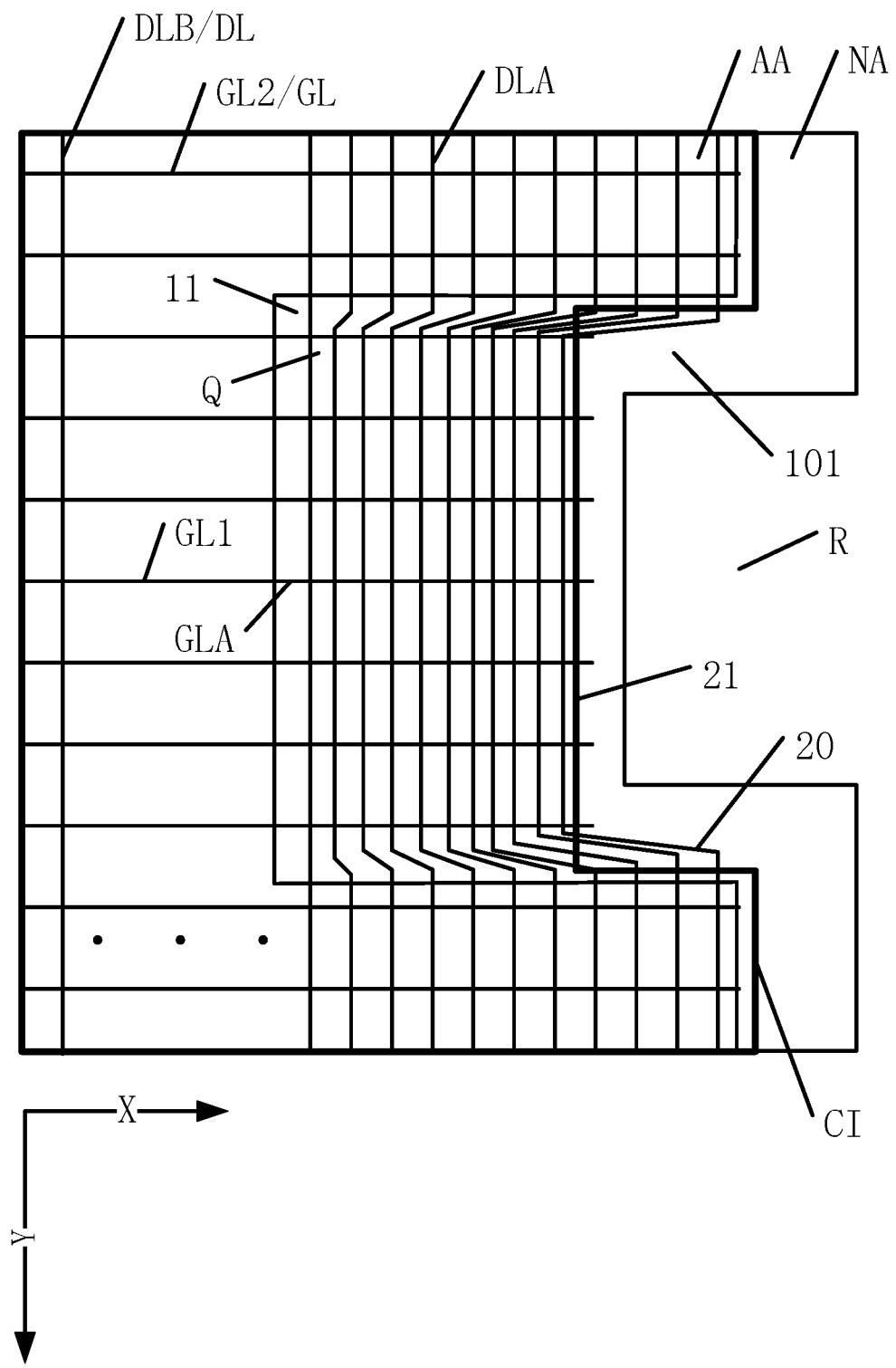
FIG. 4 illustrates a schematic top view of another exemplary display panel consistent with the disclosed embodiments.

FIG. 4 illustrates a schematic top view of another exemplary display panel consistent with the disclosed embodiments. The similarities between FIG. 4 and FIG. 2 are not repeated here, while certain differences may be explained. As shown in FIG. 4, the display area AA may include a common electrode CI, and the compensation electrode 21 and the common electrode CI may be disposed at the same layer and electrically connected to each other. In one embodiment, the compensation electrode 21 and the common electrode CI may be integrally formed. In the process of manufacturing the display panel, the compensation electrode 21 and the common electrode CI may be simultaneously formed by patterning the same conductive layer.

In the disclosed embodiments, the compensation electrode 21 and the common electrode CI may be disposed at the same layer, such that the compensation electrode 21 may be fabricated without introducing an additional film layer, which may reduce the manufacturing process and the cost of the display panel. Further, the compensation electrode 21 and the common electrode CI may be electrically connected to each other and, thus, the electric potential of the compensation electrode 21 may be the same as the electric potential of the common electrode CI. Thus, an additional electric signal may not be desired to supply to the compensation electrode 21, and the number of signals of the display panel may be simplified.

In the disclosed embodiments, the display panel may be a plasma display panel, a field emission display panel, a light-emitting display panel, an organic light-emitting display panel, a liquid crystal display (LCD) panel, a quantum dots (QDs) display panel, an electrophoretic display panel, etc. Further, the display panel may include any appropriate type of display panels which are not limited by the present disclosure. In one embodiment, the display panel may be a liquid crystal display (LCD) panel, and pixel electrodes (not drawn) may be disposed at the display area AA. Through respectively applying appropriate voltages to the common electrode and the pixel electrode, an electric field may be formed therebetween for controlling the reorientation of the liquid crystal molecules, thereby realizing a display function.

Figure 5:
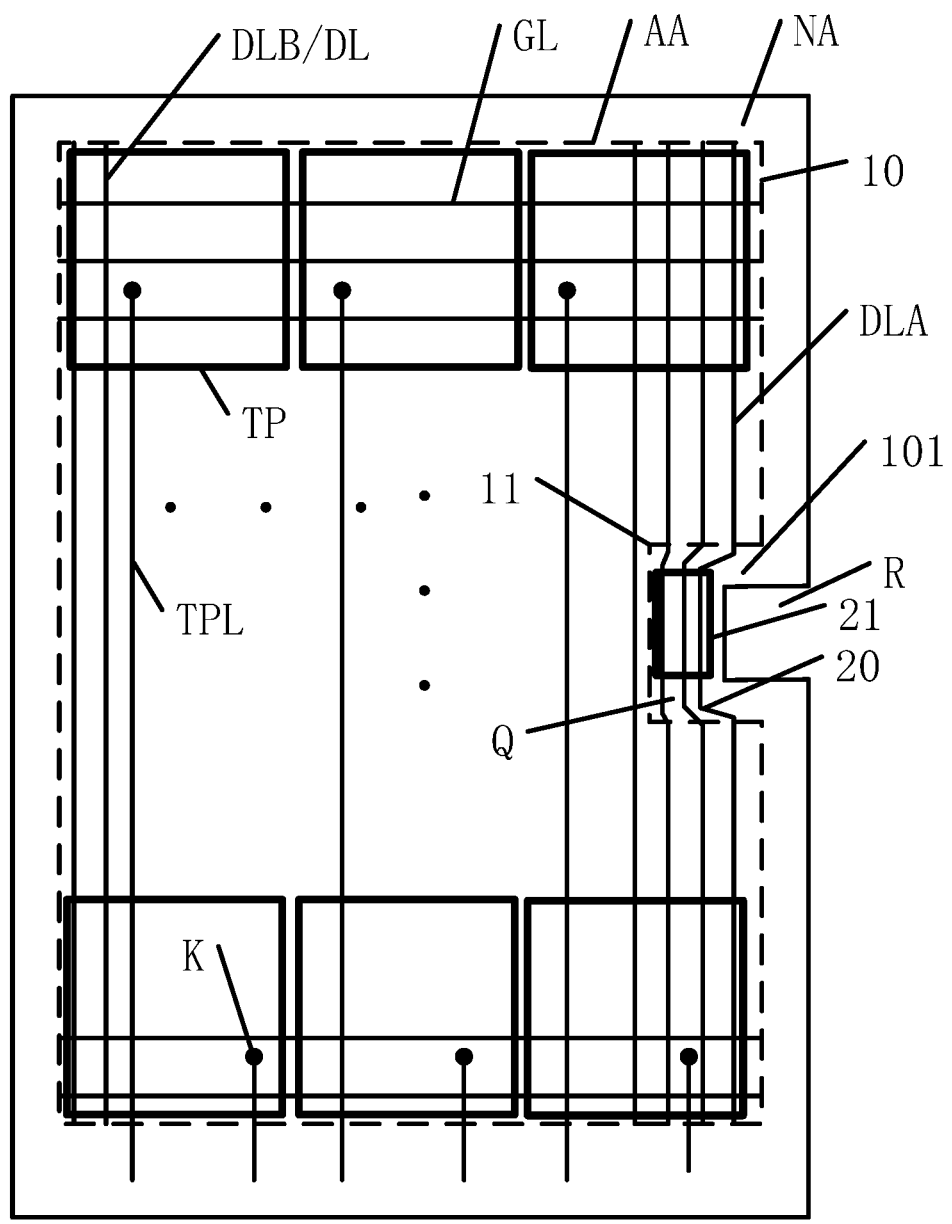
FIG. 5 illustrates a schematic top view of another exemplary display panel consistent with the disclosed embodiments.
Figure 6:
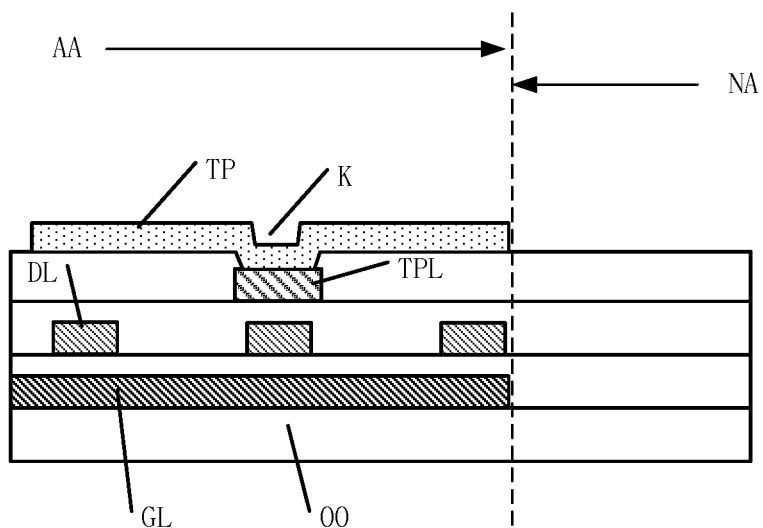
FIG. 6 illustrates an exemplary schematic cross-sectional view of the display panel in FIG. 5 consistent with the disclosed embodiments.

FIG. 5 illustrates a schematic top view of another exemplary display panel consistent with the disclosed embodiments, and FIG. 6 illustrates an exemplary schematic cross-sectional view of the display panel in FIG. 5 consistent with the disclosed embodiments. The similarities between FIGS. 5-6 and FIG. 2 are not repeated here, while certain differences may be explained.

As shown in FIGS. 5-6, the display area AA may include a plurality of touch control electrodes TP and a plurality of touch control lines TPL. The touch control lines TPL and the touch control electrodes TP may be electrically connected. The gate line GL, the data line DL, and the touch control line TPL may be respectively disposed at different film layers.

In the disclosed embodiments, the display panel may have a touch control function. In particular, the touch control electrodes TP disposed at the display area AA may be arranged in multiple rows and columns. The touch control electrode TP may form ground capacitance with the ground as basic capacitance for detecting the touch. When a touch control occurs on the display panel, the coupling capacitance between the finger and the touch control electrode TP may change the basic capacitance. By detecting the amount of change in the basic capacitance of the plurality of touch control electrodes, the touch control electrodes that are in the touch control operation may be detected, thereby determining the position of the touch control operation at the display panel.

In one embodiment, the plurality of touch control electrodes TP may be multiplexed as a common electrode, and the operation stage of the display panel may be divided into a display phase and a touch control phase. In the display phase, the touch control electrode TP may receive a common voltage signal, which is often a constant voltage signal for realizing a display function. During the touch control phase, the touch control electrode TP may receive a touch control signal, which is often a pulse signal for detecting the touch control operation.

The display panel may be further provided with a plurality of touch control lines TPL for transmitting electrical signals to the touch control electrodes TP electrically connected thereto. The touch control line TPL and the touch control electrode TP may be electrically connected by a through-hole K. The gate line GL, the data line DL, and the touch control line TPL may be respectively disposed at different film layers, for example, the gate line GL may be disposed at a first metal layer, the data line DL may be disposed at a second metal layer, and the touch control line TPL may be disposed at a third metal layer. In one embodiment, the display panel may include a base substrate 00.

Figure 7:
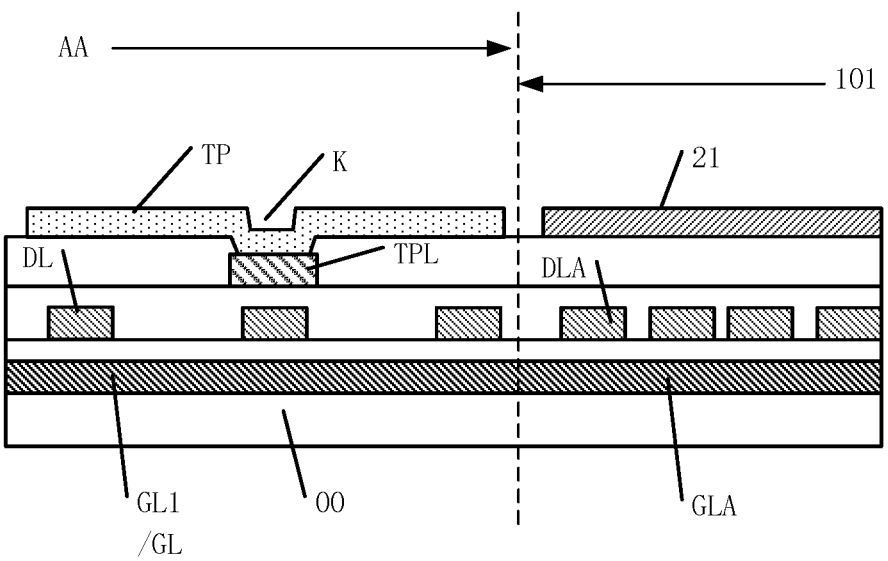
FIG. 7 illustrates another exemplary schematic cross-sectional view of the display panel in FIG. 5 consistent with the disclosed embodiments.

FIG. 7 illustrates another exemplary schematic cross-sectional view of the display panel in FIG. 5 consistent with the disclosed embodiments. The similarities between FIG. 7 and FIG. 6 are not repeated here, while certain differences may be explained.

As shown in FIG. 5 and FIG. 7, the compensation electrode 21 and the touch control electrode TP may be disposed at the same layer. In one embodiment, the compensation electrode 21 and the touch control electrode TP may be electrically insulated from each other, and receive different electrical signals respectively. Because the touch control signal is often a pulse signal and the electrical signal at the touch control electrode TP is affected by the touch control operation, the electrical signal at the touch control electrode TP may be not constant. When the compensation electrode 21 and the touch control electrode TP are electrically connected, the electrical signal at the compensation electrode 21 may be caused to be no longer constant, introducing interference to the electrical signal at the irregular-shaped data line DLA. In view of this, in the disclosed embodiments, the compensation electrode 21 and the touch control electrode TP may be configured to be electrically insulated from each other, such that the interference may be no longer introduced to the electrical signal at the irregular-shaped data line DLA.

Further, the compensation electrode 21 may be fabricated without introducing an additional film layer, thereby reducing the process and cost of the display panel.

Figure 8:
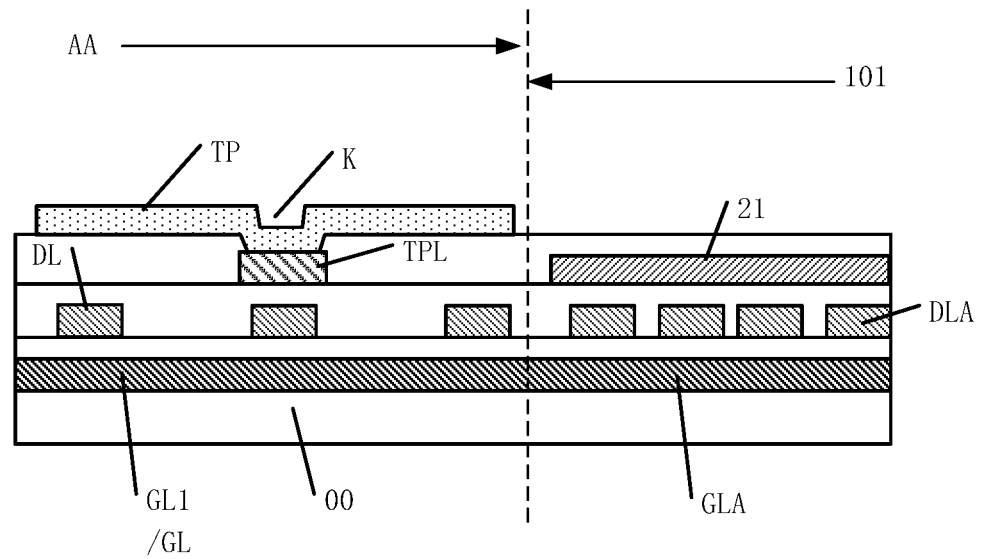
FIG. 8 illustrates another exemplary schematic cross-sectional view of the display panel in FIG. 5 consistent with the disclosed embodiments.

FIG. 8 illustrates another exemplary schematic cross-sectional view of the display panel in FIG. 5 consistent with the disclosed embodiments. The similarities between FIG. 7 and FIG. 8 are not repeated here, while certain differences may be explained.

As shown in FIG. 5 and FIG. 8, the compensation electrode 21 and the touch control line TPL may be disposed at the same layer. The compensation electrode 21 may be fabricated without introducing an additional film layer, thereby reducing the process and cost of the display panel.

Figure 9:
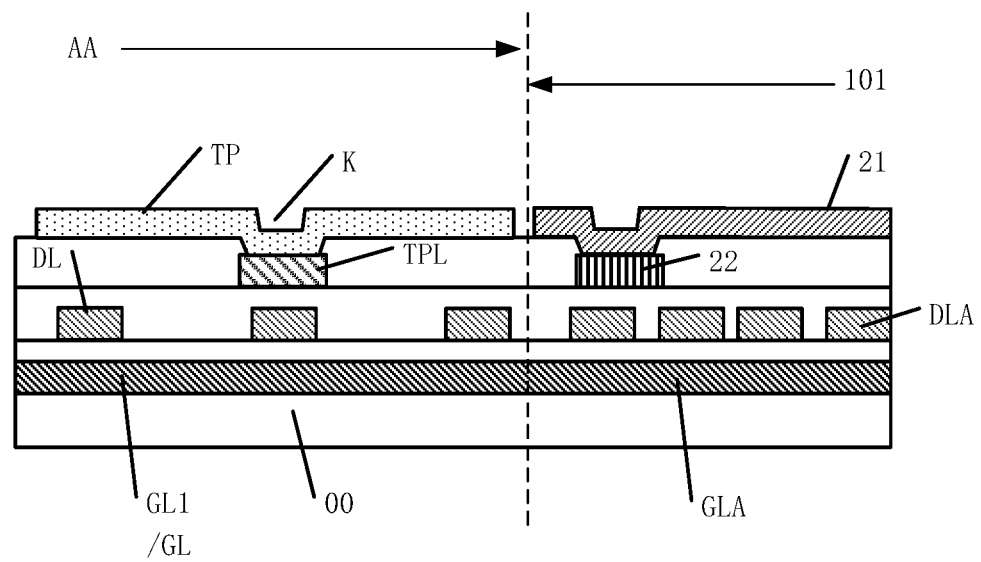
FIG. 9 illustrates another exemplary schematic cross-sectional view of the display panel in FIG. 5 consistent with the disclosed embodiments.

FIG. 9 illustrates another exemplary schematic cross-sectional view of the display panel in FIG. 5 consistent with the disclosed embodiments. The similarities between FIG. 9 and FIG. 8 are not repeated here, while certain differences may be explained.

As shown in FIG. 5 and FIG. 9, the touch control electrodes TP may be multiplexed as a common electrode CI. The display panel may further include a compensation signal line 22, which is electrically connected to the compensation electrode 21. The compensation signal line 22 and the touch control line TPL may be disposed at the same layer.

The touch control electrodes TP may be multiplexed through time sharing. During the touch control phase of the display panel, the touch control electrodes TP may be used to detect touch control operations, and during the display phase of the display panel, the touch control electrodes TP may be used to realize display function.

The compensation signal line 22 that transmits an electrical signal to the compensation electrode 21 may be disposed at the display panel. The compensation electrode 21 and the touch control electrode TP may be electrically insulated from each other, and receive different electrical signals respectively. The touch control line TPL may transmit an electrical signal to the touch control electrode TP, and the compensation signal line 22 may transmit an electrical signal to the compensation electrode 21.

Because the first sub-area 101 is disposed with both the data line trace and gate line trace, to prevent the short circuit caused by the intersection of the compensation signal line 22 and the data line trace or the intersection of the compensation signal line 22 and the gate line trace, the compensation signal line 22 may be disposed at the same film layer as the touch control line TPL. In the manufacturing process of the display panel, the touch control line TPL and the compensation signal line 22 may be simultaneously formed by patterning the same metal layer, reducing the manufacturing process and the cost of the display panel.

For illustrative purposes, FIG. 9 shows the compensation layer 21 and the touch control electrode TP are disposed at the same layer. In another embodiment, the compensation electrode 21 may be disposed at other film layers, which is not limited by the present disclosure.

Figure 10:
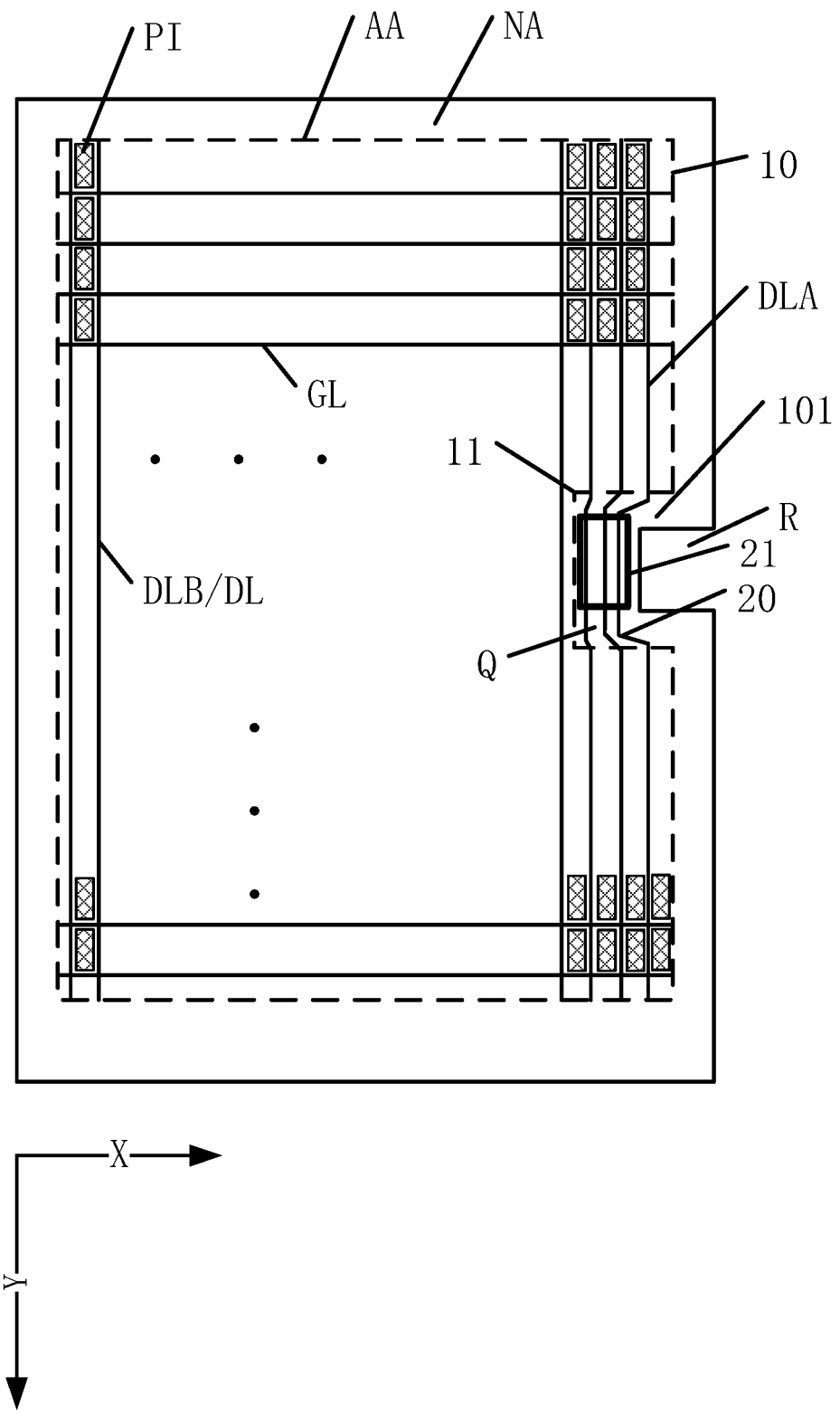
FIG. 10 illustrates a schematic top view of another exemplary display panel consistent with the disclosed embodiments.
Figure 11:
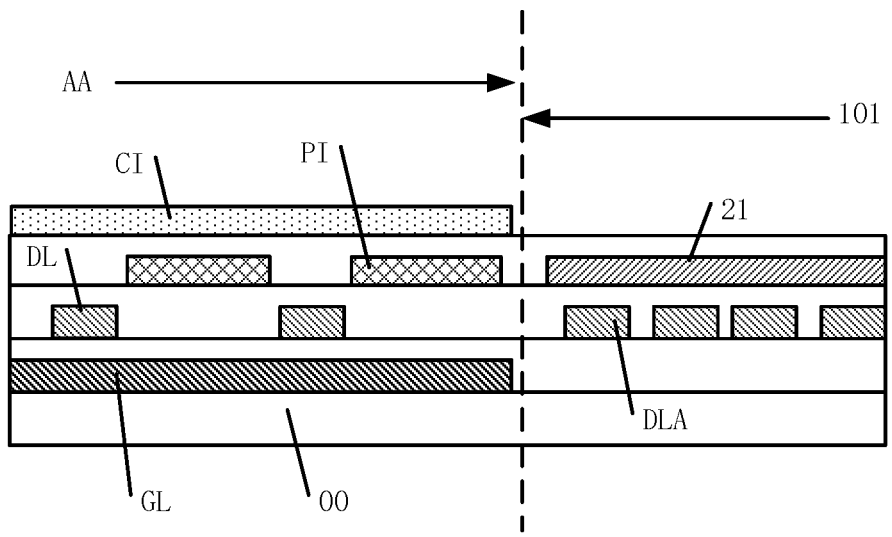
FIG. 11 illustrates an exemplary schematic cross-sectional view of the display panel in FIG. 10 consistent with the disclosed embodiments.

FIG. 10 illustrates a schematic top view of another exemplary display panel consistent with the disclosed embodiments, and FIG. 11 illustrates an exemplary schematic cross-sectional view of the display panel in FIG. 10 consistent with the disclosed embodiments. The similarities between FIGS. 5-6 and FIGS. 10-11 are not repeated here, while certain differences may be explained.

As shown in FIGS. 10-11, the display area AA may further include a plurality of pixel electrodes PI, and the compensation electrode 21 and the pixel electrodes PI may be disposed at the same layer. The pixel electrode PI may be configured for realizing a display function. In one embodiment, the display panel may be a liquid crystal display (LCD) panel. Through respectively applying appropriate voltages to the common electrode and the pixel electrodes in the LCD panel, an electric field may be formed therebetween for controlling the reorientation of the liquid crystal molecules, thereby realizing the display function.

In the manufacturing process of the display panel, the pixel electrodes PI and the compensation electrode 21 may be simultaneously formed by patterning the same metal layer, such that the compensation electrode 21 may be fabricated without introducing extra film layers, which may reduce the manufacturing process and the cost of the display panel.

Figure 12:
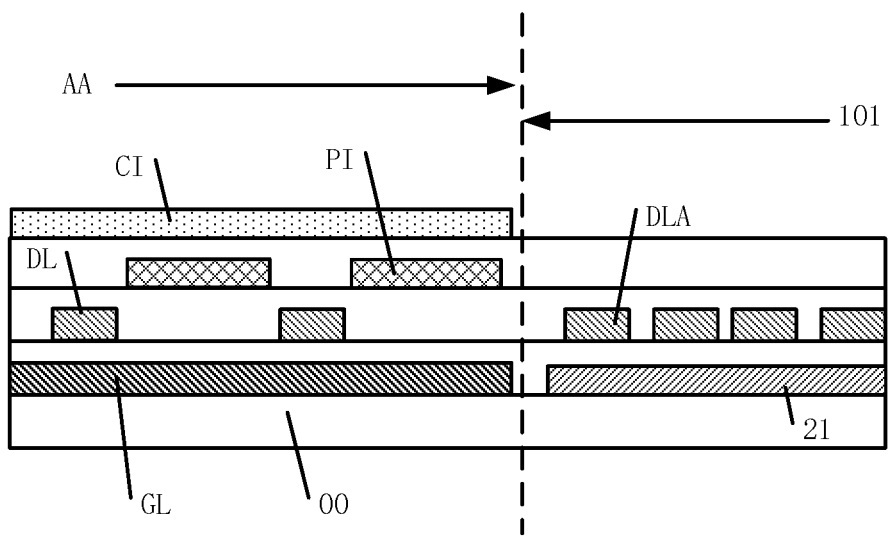
FIG. 12 illustrates another exemplary schematic cross-sectional view of the display panel in FIG. 10 consistent with the disclosed embodiments.

FIG. 12 illustrates another exemplary schematic cross-sectional view of the display panel in FIG. 10 consistent with the disclosed embodiments. The similarities between FIG. 11 and FIG. 12 are not repeated here, while certain differences may be explained.

As shown in FIG. 10 and FIG. 12, the compensation electrode 21 and the gate lines GL may be disposed at the same layer. In the manufacturing process of the display panel, the gate lines GL and the compensation electrode 21 may be simultaneously formed by patterning the same metal layer, such that the compensation electrode 21 may be fabricated without introducing extra film layers, which may reduce the manufacturing process and the cost of the display panel.

It should be noted that, in the above embodiments, the present disclosure only exemplifies the structure of the film layer where the compensation electrode is disposed. It is understood that the compensation electrode may be disposed at other film layers of the display panel, as long as the compensation electrode is at least partially overlapped with the winding portion, and electrically insulated from the winding portion.

Figure 13:
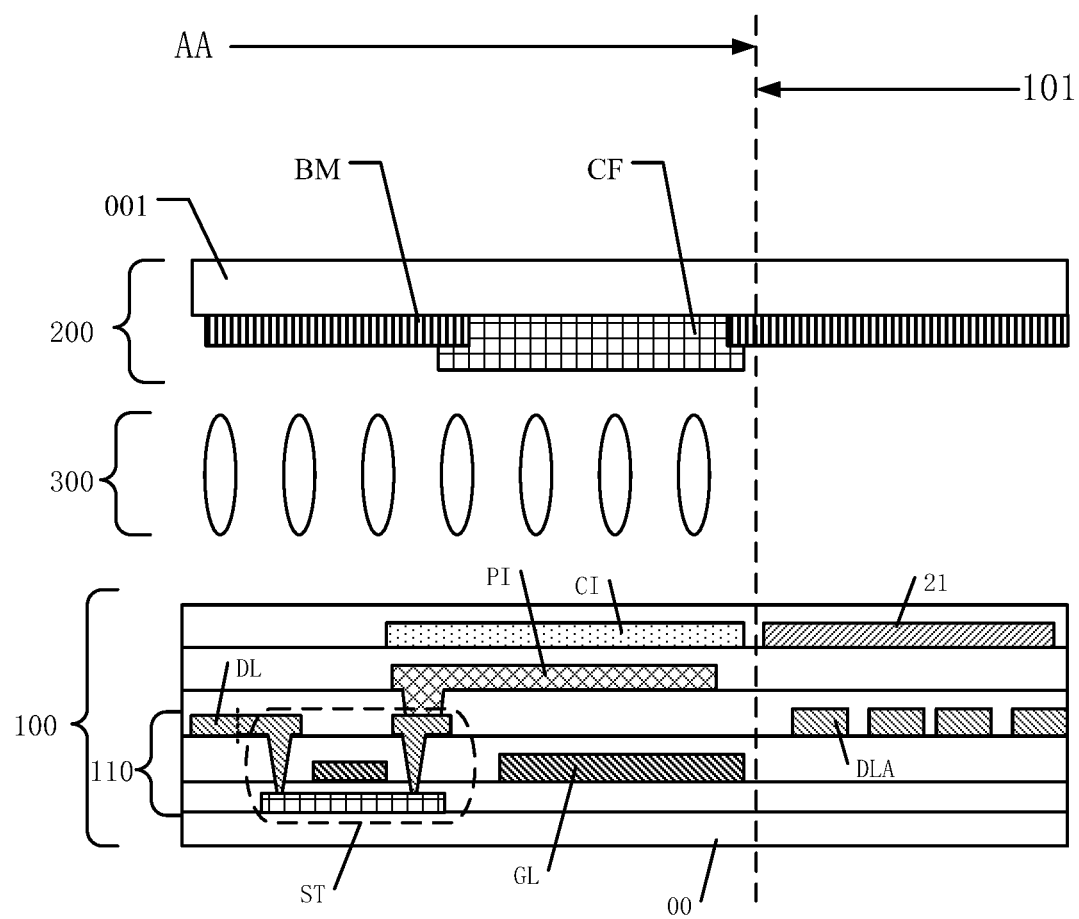
FIG. 13 illustrates an exemplary schematic cross-sectional view of the display panel in FIG. 2 consistent with the disclosed embodiments.

FIG. 13 illustrates an exemplary schematic cross-sectional view of the display panel in FIG. 2 consistent with the disclosed embodiments. As shown in FIG. 2 and FIG. 13, the display panel may include a first substrate 100, a second substrate 200 arranged opposite to the first substrate 100, and a liquid crystal (LC) layer 300 disposed between the first substrate 100 and the second substrate 200. The first substrate 100 may include the plurality of gate lines GL and the plurality of data lines DL. The display panel may be an LCD panel, in one embodiment, the first substrate 100 may be an array substrate, and the second substrate 200 may be a color film substrate.

In one embodiment, the first substrate 100 may include an array layer 110, and the array layer 110 may include a plurality of thin film transistors ST. Each thin film transistor ST may include a semiconductor portion T1, a gate electrode T2, a source electrode T3, and a drain electrode T4. The gate electrode T2 and the gate lines GL may be disposed at the same layer. The source electrode T3, the drain electrode T4 and the data lines DL may be disposed at the same layer. The data line DL and the source electrode T3 may be electrically connected, and the drain electrode T4 and the pixel electrode PI may be electrically connected.

In one embodiment, the color film substrate may comprise a substrate 001, and a black matrix BM and color filters CF disposed on the substrate 001.

The present disclosure further provides a display device, including any one of the disclosed display panels and a housing for accommodating the display panel.

Figure 14:
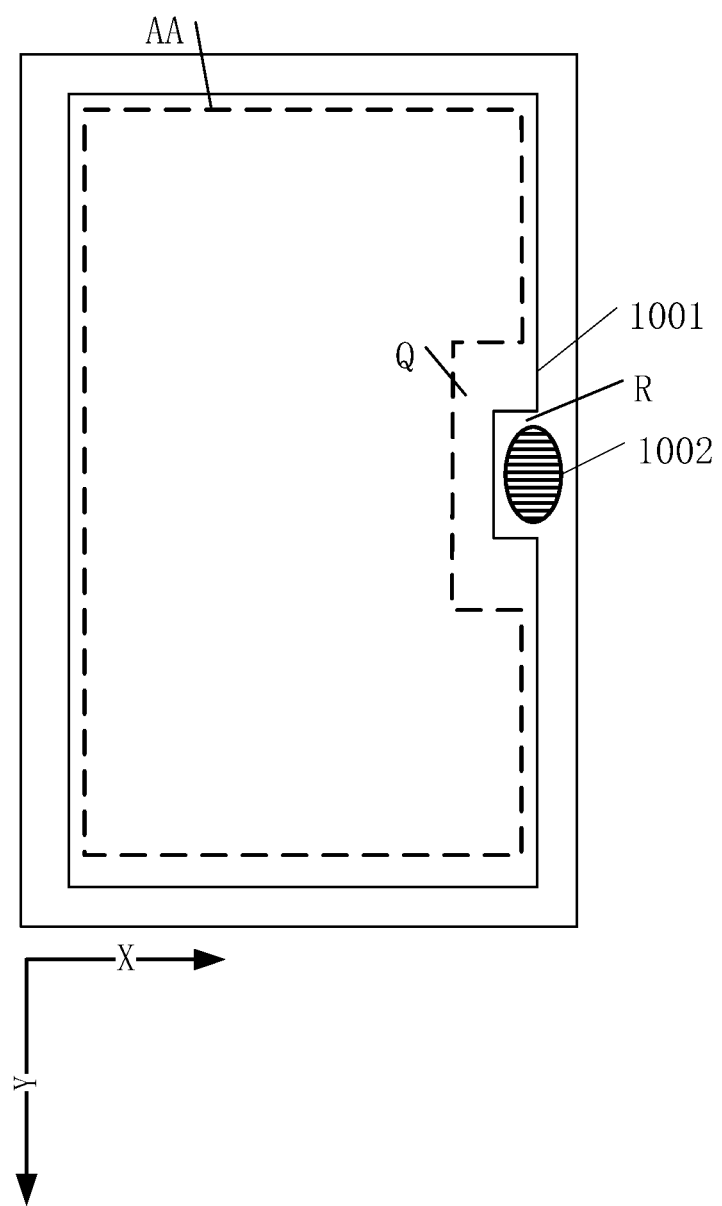
FIG. 14 illustrates a schematic top view of an exemplary display device consistent with the disclosed embodiments.

FIG. 14 illustrates a schematic top view of an exemplary display device 1000 consistent with the disclosed embodiments. As shown in FIG. 14, the display device 1000 may include a display panel 1001. The display panel 1001 may be any one of the disclosed display panels. FIG. 14 shows the display device 1000 may be a mobile phone, which is for illustrative purposes and is not intended to limit the scope of the present disclosure. The display device 1000 may also be any display device with a display function and/or fingerprint recognition function, such as a laptop, a television, a tablet, and an in-vehicle display device, etc., which is not limited by the present discourse. Because the disclosed display device includes any one of the disclosed display panels, the disclosed display device may also have the same features as the disclosed display panel, and details are not described herein again.

In one embodiment, as shown in FIG. 14, the display panel 1001 may include a groove R, and the groove R and a first sub-area 101 may be disposed adjacent to each other in a row direction X. The display device may further include a light sensing element 1002 disposed at the groove R.

In the disclosed embodiments, the light sensing element 1002 may be disposed at the groove R to detect an optical signal and convert the optical signal into an electrical signal. For example, the light sensing element 1002 may include a camera, and an infrared sensor, etc. The specific structure of the light sensing element 1002 is not limited by the present discourse.

In the disclosed embodiments, the display area may have an irregular shape disposed with the notch, at least one data line may be desired to be routed from the first sub-area, i.e., the irregular-shaped data line. A portion of the irregular-shaped data line where the portion is disposed at the first sub-area may be the winding portion. The compensation electrode may be disposed at the first sub-area, and the compensation electrode and the winding portion may be overlapped to form a coupling capacitance, thereby increasing the load of the irregular-shaped data line. Compared to the existing display panel, in the disclosed display panel, the load difference between the irregular-shaped data line and the regular data line may be reduced, such that the split-screen of the display panel may be suppressed, the uniformity of the display performance may be improved, and the display performance may be enhanced.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
a display area including a plurality of gate lines extending in a row direction, a plurality of data lines extending in a column direction, and an irregular-shaped edge, wherein the irregular-shaped edge includes at least one sub-edge which is recessed towards an inside of the display area to form a notch, and edges of the irregular-shaped edge other than the at least one sub-edge extend in the column direction; and
a non-display area surrounding the display area, wherein the non-display area includes a first sub-area disposed adjacent to the at least one sub-edge,
wherein the plurality of data lines include at least one irregular-shaped data line,
the at least one irregular-shaped data line includes a winding portion disposed at the first sub-area,
the first sub-area includes a compensation electrode, and
in a direction perpendicular to the display panel, the compensation electrode in the first sub-area of the non-display area disposed adjacent to the at least one sub-edge is at least partially overlapped with the winding portion of the at least one irregular-shaped data line recessed in the notch and connecting two regular-shaped data line portions recessed by the notch, such that the compensation electrode and an overlapped portion of the winding portion form a coupling capacitance to increase a load of the at least one irregular-shaped data line.

2. The display panel according to claim 1, wherein:
the plurality of gate lines include at least one first gate line;
the at least one first gate line includes an extending portion disposed at the first sub-area; and
the compensation electrode is overlapped with the extending portion of the first gate line in the direction perpendicular to the display panel, such that the compensation electrode and an overlapped portion of the extending portion form another coupling capacitance to increase a load of the first gate line in addition to the load of the irregular-shaped data line.

3. The display panel according to claim 2, wherein:
the extending portion is overlapped with the winding portion in the direction perpendicular to the display panel.

4. The display panel according to claim 1, wherein:
the display area includes a common electrode, wherein the compensation electrode and the common electrode are disposed at a same layer and electrically connected to each other.

5. The display panel according to claim 1, wherein:
the display area includes a plurality of touch control electrodes and a plurality of touch control lines, wherein a touch control line is electrically connected to a touch control electrode, and
the gate lines, the data lines, and the touch control lines are disposed at different layers.

6. The display panel according to claim 5, wherein:
the compensation electrode and the touch control electrodes are disposed at a same layer.

7. The display panel according to claim 5, wherein:
the compensation electrode and the touch control lines are disposed at a same layer.

8. The display panel according to claim 5, wherein:
the touch control electrode is multiplexed as a common electrode;
the display panel further includes a compensation signal line electrically connected to the compensation electrode, wherein the compensation signal line and the touch control line are disposed at a same layer.

9. The display panel according to claim 1, wherein:
the display area includes a plurality of pixel electrodes, wherein the compensation electrode and the pixel electrodes are disposed at a same layer.

10. The display panel according to claim 1, wherein:
the compensation electrode and the gate lines are disposed at a same layer.

11. The display panel according to claim 1, further comprising:
a groove penetrating the display panel in a thickness direction of the display panel, wherein the groove and the first sub-area are disposed adjacent to each other in the row direction.

12. The display panel according to claim 1, further comprising:
a first substrate;
a second substrate arranged opposite to the first substrate; and
a liquid crystal (LC) layer disposed between the first substrate and the second substrate,
wherein the first substrate is disposed with the plurality of gate lines and the plurality of data lines.

13. The display panel according to claim 12, wherein:
the first substrate includes an array layer; and
the array layer includes a plurality of thin film transistors, wherein a thin film transistor includes a semiconductor portion, a gate electrode, a source electrode, and a drain electrode,
wherein the gate electrode and the plurality of gate lines are disposed at a same layer, and
the source electrode, the drain electrode and the plurality of data lines are disposed at a same layer.

14. A display device, comprising:
a display panel, wherein the display panel comprises:
a display area including a plurality of gate lines extending in a row direction, a plurality of data lines extending in a column direction, and an irregular-shaped edge, wherein the irregular-shaped edge includes at least one sub-edge which is recessed towards an inside of the display area to form a notch, and edges of the irregular-shaped edge other than the at least one sub-edge extend in the column direction; and a non-display area surrounding the display area, wherein the non-display area includes a first sub-area disposed adjacent to the at least one sub-edge, wherein the plurality of data lines include at least one irregular-shaped data line, the at least one irregular-shaped data line includes a winding portion disposed at the first sub-area, the first sub-area includes a compensation electrode, and in a direction perpendicular to the display panel, the compensation electrode in the first sub-area of the non-display area disposed adjacent to the at least one sub-edge is at least partially overlapped with the winding portion of the at least one irregular-shaped data line recessed in the notch and connecting two regular-shaped data line portions recessed by the notch, such that the compensation electrode and an overlapped portion of the winding portion form a coupling capacitance to increase a load of the at least one irregular-shaped data line.

15. The display device according to claim 14, wherein:
the display panel further includes a groove disposed adjacent to the first sub-area in the row direction; and
the display device further includes a light sensing element disposed at the groove.

16. The display device according to claim 14, wherein:
the plurality of gate lines include at least one first gate line;
the at least one first gate line includes an extending portion disposed at the first sub-area; and
the compensation electrode is overlapped with the extending portion of the first gate line in the direction perpendicular to the display panel, such that the compensation electrode and an overlapped portion of the extending portion form another coupling capacitance to increase a load of the first gate line in addition to the load of the irregular-shaped data line.

* * * * *